(12) United States Patent
Oh et al.

(10) Patent No.: US 12,133,420 B2
(45) Date of Patent: Oct. 29, 2024

(54) DISPLAY DEVICE AND MANUFACTURING METHOD THEREOF

(71) Applicant: Samsung Display Co., Ltd., Yongin-si (KR)

(72) Inventors: Eonseok Oh, Yongin-si (KR); Hyungsik Kim, Yongin-si (KR); Jungmin Choi, Yongin-si (KR); Sangyeol Kim, Yongin-si (KR); Woosik Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 3 days.

(21) Appl. No.: 16/826,626

(22) Filed: Mar. 23, 2020

(65) Prior Publication Data

US 2020/0403047 A1    Dec. 24, 2020

(30) Foreign Application Priority Data

Jun. 18, 2019   (KR) .......................... 10-2019-0072418

(51) Int. Cl.
*H10K 59/122*    (2023.01)
*H10K 50/842*    (2023.01)
(Continued)

(52) U.S. Cl.
CPC ....... *H10K 59/122* (2023.02); *H10K 50/8426* (2023.02); *H10K 50/844* (2023.02);
(Continued)

(58) Field of Classification Search
CPC ............ H01L 51/5253; H01L 51/5256; H01L 51/5246; H01L 51/0016; H01L 51/56;
(Continued)

(56) References Cited

U.S. PATENT DOCUMENTS 9,343,699 B2    5/2016   Kwak
9,905,629 B2    2/2018   Kim et al.
(Continued)

FOREIGN PATENT DOCUMENTS

CN    109671864 A    4/2019
CN    109309099 B    5/2020
(Continued)

*Primary Examiner* — Vongsavanh Sengdara
(74) *Attorney, Agent, or Firm* — Lewis Roca Rothgerber Christie LLP

(57) ABSTRACT

A display apparatus includes: a substrate including a display area in which thin film transistors and display devices electrically connected to the thin film transistors are arranged and a first non-display area outside the display area; a through portion vertically penetrating the substrate; a second non-display area between the through portion and the display area; and an encapsulation layer on the display devices and including a first inorganic encapsulation layer, an organic encapsulation layer, and a second inorganic encapsulation layer, which are sequentially stacked. The first inorganic encapsulation layer and the second inorganic encapsulation layer extend to the through portion and directly contact each other in the second non-display area, and the first inorganic encapsulation layer directly contacts another inorganic layer thereunder in the second non-display area.

10 Claims, 11 Drawing Sheets

(51) Int. Cl.
   *H10K 50/844* (2023.01)
   *H10K 59/12* (2023.01)
   *H10K 59/124* (2023.01)
   *H10K 71/00* (2023.01)

(52) U.S. Cl.
   CPC ........... *H10K 59/124* (2023.02); *H10K 71/00* (2023.02); *H10K 59/1201* (2023.02)

(58) Field of Classification Search
   CPC ............. H01L 27/3258; H01L 27/3246; H01L 2227/323; H10K 59/124; H10K 59/8731; H10K 59/1201; H10K 59/122; H10K 50/844; H10K 50/8426; H10K 71/221; H10K 71/00
   See application file for complete search history.

(56) References Cited

U.S. PATENT DOCUMENTS

| | | | |
|---|---|---|---|
| 10,135,025 B2 | 11/2018 | Kim et al. | |
| 10,186,191 B2 | 1/2019 | Kang et al. | |
| 10,205,122 B2 | 2/2019 | Choi et al. | |
| 10,304,913 B2 | 5/2019 | Choi et al. | |
| 10,615,369 B2 | 4/2020 | Choi et al. | |
| 10,790,317 B2 | 9/2020 | Wang | |
| 10,833,292 B2 | 11/2020 | Shi | |
| 11,398,541 B2 | 7/2022 | Ito et al. | |
| 2015/0060786 A1* | 3/2015 | Kwak | H01L 27/3262 257/40 |
| 2016/0190389 A1 | 6/2016 | Lee et al. | |
| 2017/0047544 A1 | 2/2017 | Kang et al. | |
| 2017/0110532 A1 | 4/2017 | Kim et al. | |
| 2017/0162637 A1* | 6/2017 | Choi | H01L 21/28 |
| 2017/0288003 A1* | 10/2017 | Kim | H10K 59/123 |
| 2018/0159077 A1 | 6/2018 | Lee et al. | |
| 2018/0183015 A1 | 6/2018 | Yun et al. | |
| 2019/0051859 A1* | 2/2019 | Choi | H10K 59/1213 |
| 2019/0122608 A1 | 4/2019 | Kang et al. | |
| 2019/0148672 A1 | 5/2019 | Seo et al. | |
| 2020/0052051 A1 | 2/2020 | Lee et al. | |
| 2020/0176520 A1* | 6/2020 | Kim | H10K 50/844 |

FOREIGN PATENT DOCUMENTS

| | | |
|---|---|---|
| KR | 10-1483193 B1 | 1/2015 |
| KR | 10-2015-0025260 A | 3/2015 |
| KR | 10-2016-0001500 A | 1/2016 |
| KR | 10-2017-0059864 A | 5/2017 |
| KR | 10-2017-0065059 A | 6/2017 |
| KR | 10-2017-0066767 A | 6/2017 |
| KR | 10-2017-0096646 A | 8/2017 |
| KR | 10-2017-0115177 A | 10/2017 |
| KR | 10-2019-0018120 A | 2/2019 |
| WO | WO 2019/073678 A1 | 4/2019 |

* cited by examiner

DISPLAY DEVICE AND MANUFACTURING METHOD THEREOF

CROSS-REFERENCE TO RELATED APPLICATION

This application claims priority to and the benefit of Korean Patent Application No. 10-2019-0072418, filed on Jun. 18, 2019 in the Korean Intellectual Property Office, the entire disclosure of which is incorporated herein by reference.

BACKGROUND

1. Field

Aspects of one or more embodiments relate to a display apparatus and a manufacturing method thereof.

2. Description of Related Art

Recently, physical buttons and the like have been removed from the front of the display device, and a display area for displaying an image has expanded. Also, a display apparatus in which a separate member for expanding a function of the display apparatus, such as a camera and the like, and placed in the display area to increase the display area has been introduced. To place a separate member such as a camera in a display area, a groove or a through portion where the separate member may be located is formed in the display area. However, the groove or the through portion formed in the display area may become a new permeable path through which external moisture, etc. may penetrate into the display area.

SUMMARY

According to an aspect of one or more embodiments, a display apparatus in which penetration of external moisture, etc. through a through portion in a display area is prevented or substantially prevented, and a manufacturing method of the display apparatus, are provided.

Additional aspects will be set forth, in part, in the description which follows and, in part, will be apparent from the description, or may be learned by practice of the presented embodiments of the disclosure.

According to one or more embodiments, a display apparatus includes: a substrate including a display area in which a plurality of thin film transistors and a plurality of display devices electrically connected to the plurality of thin film transistors are arranged and a first non-display area outside the display area; a through portion penetrating the substrate in a vertical direction; a second non-display area between the through portion and the display area; and an encapsulation layer on the plurality of display devices and including a first inorganic encapsulation layer, an organic encapsulation layer, and a second inorganic encapsulation layer, which are sequentially stacked, wherein the first inorganic encapsulation layer and the second inorganic encapsulation layer extend to the through portion and directly contact each other in the second non-display area, and the first inorganic encapsulation layer directly contacts another inorganic layer under the first inorganic encapsulation layer in the second non-display area.

The first inorganic encapsulation layer may directly contact an upper surface of the substrate in the second non-display area.

The substrate may include a first base layer, a first barrier layer, a second base layer, and a second barrier layer, which are sequentially stacked, and the first inorganic encapsulation layer may directly contact the second barrier layer in the second non-display area.

The display apparatus may further include a first inorganic insulating layer between a semiconductor layer and a gate electrode of each of the plurality of thin film transistors, and a second inorganic insulating layer between the gate electrode and a source electrode and between the gate electrode and a drain electrode of each of the plurality of thin film transistors, and the another inorganic layer, which directly contacts the first inorganic encapsulation layer in the second non-display area, may include the first inorganic insulating layer or the second inorganic insulating layer.

The display apparatus may further include a planarization layer between the plurality of thin film transistors and the plurality of display devices, the planarization layer may extend to a part of the second non-display area.

Each of the plurality of display devices may include a pixel electrode on the planarization layer, an opposite electrode on the pixel electrode, and an intermediate layer between the pixel electrode and the opposite electrode, and at least some layers of the intermediate layer and the opposite electrode may extend outside the planarization layer.

In the second non-display area, a first internal dam around the through portion may be arranged on the planarization layer, and the organic encapsulation layer may be outside an area partitioned by the first internal dam.

The display apparatus may further include a pixel-defining layer on the planarization layer and covering edges of the pixel electrodes of the plurality of display devices, and the first internal dam may include a same material as the pixel-defining layer.

The display apparatus may further include a second internal dam in the second non-display area and surrounding the through portion at a location apart from the first internal dam, the second internal dam being on the planarization layer.

In the second non-display area, a plurality of data lines may be arranged on the second inorganic insulating layer, the planarization layer may cover the plurality of data lines, and the first internal dam may overlap at least some of the plurality of data lines.

According to one or more embodiments, a manufacturing method of a display apparatus including a display area, a first non-display area around the display area, and a second non-display area of which at least a portion is surrounded by the display area, includes: forming, in the display area, a plurality of thin film transistors on a substrate, a planarization layer covering the plurality of thin film transistors, and a plurality of pixel electrodes on the planarization layer and electrically connected to the plurality of thin film transistors; forming a metal layer in the second non-display area; forming an intermediate layer and an opposite electrode on the plurality of pixel electrodes; removing the metal layer from the substrate; sequentially forming a first inorganic encapsulation layer, an organic encapsulation layer, and a second inorganic encapsulation layer on the opposite electrode; and forming a through portion penetrating the substrate in a portion of the second non-display area, wherein at least some layers of the intermediate layer and the opposite electrode extend from the display area to the second non-display area and are formed on the metal layer, and the at least some layers of the intermediate layer and the opposite electrode which are formed on the metal layer are separated from the substrate by removal of the metal layer.

The metal layer may be formed concurrently with the plurality of pixel electrodes.

Each of the plurality of thin film transistors may include a semiconductor layer, a gate electrode, a source electrode, and a drain electrode, and the metal layer may be formed concurrently with the semiconductor layer, the gate electrode, or the source electrode, and the drain electrode.

The first inorganic encapsulation layer and the second inorganic encapsulation layer may directly contact each other in a region from which the metal layer is removed, the first inorganic encapsulation layer may directly contact another inorganic layer arranged under the first inorganic encapsulation layer in the region from which the metal layer is removed, and the through portion may be formed by penetrating the substrate, the first inorganic encapsulation layer, the second inorganic encapsulation layer, and the another inorganic layer.

A first inorganic insulating layer between the semiconductor layer and the gate electrode of each of the plurality of thin film transistors and a second inorganic insulating layer between the gate electrode and a source electrode and between the gate electrode and a drain electrode of each of the plurality of thin film transistors may extend to a part of the second non-display area, and the metal layer may be formed on the first inorganic insulating layer or the second inorganic insulating layer.

The substrate may include a first base layer, a first barrier layer, a second base layer, and a second barrier layer which are sequentially stacked, and the first inorganic encapsulation layer may directly contact the second barrier layer in the region from which the metal layer is removed.

The manufacturing method may further include forming, on the planarization layer, a pixel-defining layer covering edges of the plurality of pixel electrodes, wherein the planarization layer may extend to part of the second non-display area to be spaced by a distance from the metal layer, and, in the second non-display area, a first internal dam including a same material as the pixel-defining layer may be formed on the planarization layer.

The first internal dam may surround the through portion, and the organic encapsulation layer may be located outside an area partitioned by the first internal dam.

At least one layer of the intermediate layer may contact the another inorganic layer arranged under the first inorganic encapsulation layer in a gap between the metal layer and the planarization layer.

In the second non-display area, a plurality of data lines covered by the planarization layer may be formed, and the first internal dam is formed by overlapping at least some of the plurality of data lines.

BRIEF DESCRIPTION OF THE DRAWINGS

The above and other aspects, features, and advantages of embodiments of the disclosure will be more apparent from the following description of some example embodiments taken in conjunction with the accompanying drawings, in which.

DETAILED DESCRIPTION

Figure 1:
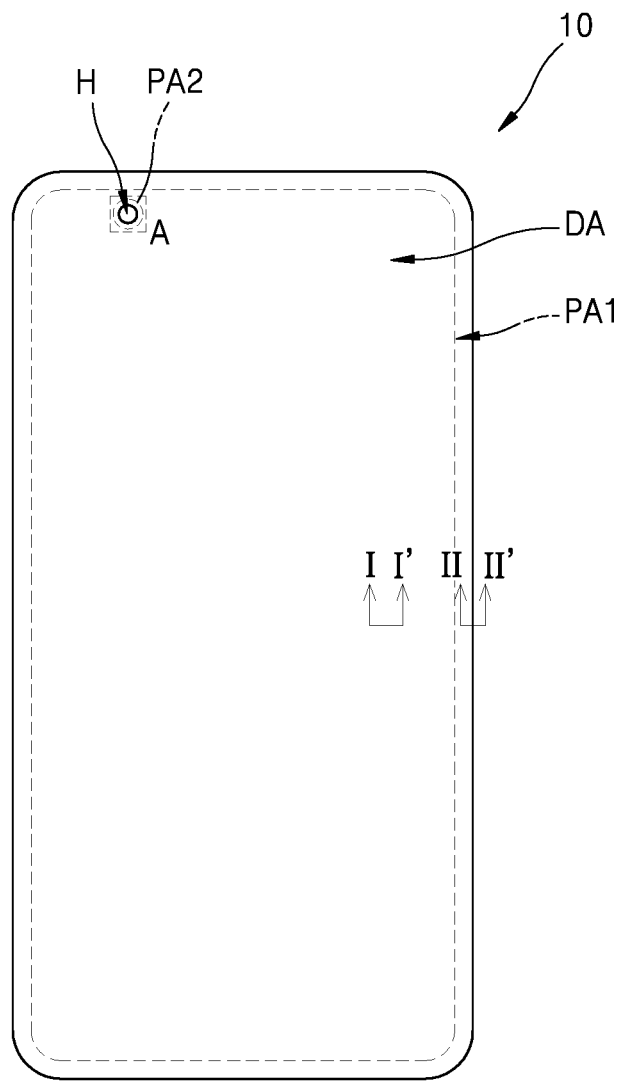
FIG. 1 is a schematic plan view of a display apparatus according to an example embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It is to be understood that when a component, such as a layer, a film, a region, or a plate, is referred to as being "on" another component, the component can be directly on the other component or one or more intervening components may be present.

Sizes of components in the drawings may be exaggerated for convenience of explanation. In other words, since sizes and thicknesses of components in the drawings may be arbitrarily illustrated for convenience of explanation, the embodiments are not limited thereto.

When a certain embodiment may be implemented differently, a specific process order may be performed differently from the described order. For example, two consecutively described processes may be performed substantially at the same time or performed in an order opposite to the described order.

The present disclosure will now be described more fully with reference to the accompanying drawings, in which some example embodiments of the invention are shown, and like reference numerals in the drawings denote like elements.

It is to be understood that although terms such as "first" and "second" may be used herein to describe various components, these components are not limited by these terms, and the terms are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

In embodiments set forth herein, when a layer, area, or component is connected to another layer, area, or component, the layers, areas, or components may be directly connected to each other, and the layers, areas, or components may also be indirectly connected to each other with another layer, area, or component therebetween.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
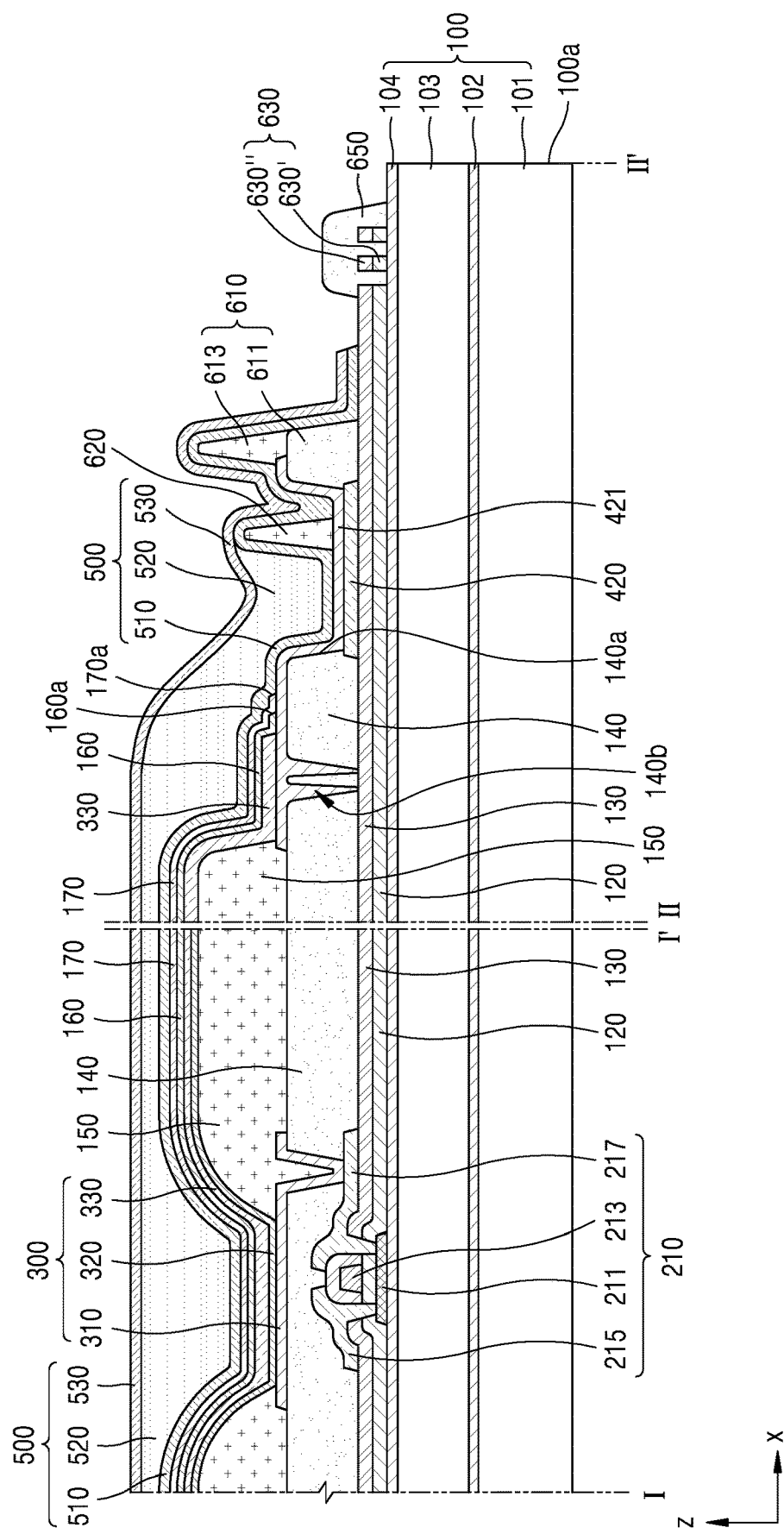
FIG. 2 is a schematic cross-sectional view of the display apparatus of FIG. 1, taken along the line I-I' and the line II-II' of FIG. 1.

FIG. 1 is a schematic plan view of a display apparatus according to an example embodiment; and FIG. 2 is a schematic cross-sectional view of the display apparatus of FIG. 1, taken along the line I-I' and the line II-II' of FIG. 1.

Referring to FIGS. 1 and 2, a display apparatus 10 includes a display area DA to display images, a first non-display area PA1 around the display area DA, and a second non-display area PA2 of which at least a portion or some portions are surrounded by the display area DA. A substrate 100 includes the display area DA, the first non-display area PA1, and the second non-display area PA2.

A display device is in the display area DA, and the first non-display area PA1 may include a pad area or the like where any of various electronic devices, a printed circuit board, or the like are electrically connected.

In the display area DA, a thin film transistor 210 electrically connected to the display device may be disposed in addition to the display device. FIG. 2 illustrates, in an embodiment, that an organic light-emitting device 300 is disposed in the display area DA as the display device. The electrical connection of the organic light-emitting device 300 to the thin film transistor 210 may be construed that a pixel electrode 310 of the organic light-emitting device 300 is electrically connected to the thin film transistor 210.

At least a portion or some portions of the second non-display area PA2 are surrounded by the display area DA, and disposed between display area DA and at least one through portion H. FIG. 1 illustrates that the second non-display area PA2 is within the display area DA and thus fully surrounded by the same, but one or more embodiments are not limited thereto. For example, part of the second non-display area PA2 may contact the first non-display area PA1.

The through portion H may be a space for a separate member for one or more functions of the display apparatus 10 or a separate member that may add a new function to the display apparatus 10. For example, any of a sensor, a light source, a camera module, and the like may be disposed in the through portion H. In an embodiment, there may be at least two through portions H.

Because the through portion H is a region where the substrate 100 and layers stacked on the substrate 100 are vertically penetrated, external moisture or oxygen may penetrate into the display apparatus 10 through an internal vertical side surface of the display apparatus 10 that is exposed through the through portion H. However, according to embodiments, the second non-display area PA2 may include a moat area MA surrounding the through portion H, and, thus, moisture penetration may be effectively prevented or substantially prevented. The moat area MA will be described in further detail with reference to FIG. 3, and a structure of the display apparatus 10 according to an embodiment will be described first with reference to FIG. 2.

The substrate 100 may include any of various materials. When the display apparatus 10 is of a bottom-emission type in which images are produced towards the substrate 100, the substrate 100 includes a transparent material. However, when the display apparatus 10 is of a top-emission type in which images are produced in a direction away from the substrate 100, the substrate 100 may not include a transparent material. In this case, the substrate 100 may include a metal. When the substrate 100 includes a metal, the substrate 100 may include any of iron (Fe), chromium (Cr), manganese (Mn), nickel (Ni), titanium (Ti), molybdenum (Mo), steel use stainless (SUS), an Invar alloy, an Inconel alloy, a Kovar alloy, etc.

For example, the substrate 100 may have a multilayer structure in which a first base layer 101, a first barrier layer 102, a second base layer 103, and a second barrier layer 104 are sequentially stacked.

In an embodiment, the first base layer 101 and the second base layer 103 may each include a transparent glass material that mainly includes, for example, $SiO_2$. However, the first base layer 101 and the second base layer 103 are not limited thereto and may each include a transparent plastic material. The plastic material may be polyether sulfone, polyacrylate, polyetherimide, polyethylene napthalate, polyethylene terepthalate, polyphenylene sulfide, polyarylate, polyimide (PI), polycarbonate, cellulose triacetate, cellulose acetate propionate, or the like.

Thicknesses of the first base layer 101 and the second base layer 103 may be the same or different. For example, each of the first base layer 101 and the second base layer 103 may include PI and may have a thickness between about 3 μm and about 20 μm.

The first barrier layer 102 and the second barrier layer 104 are layers that prevent or substantially prevent external impurities from penetrating into the display apparatus 10 through the substrate 100 and may each be a layer or layers including any of inorganic materials such as silicon nitride ($SiN_x$) and/or silicon oxide ($SiO_x$). For example, the first barrier layer 102 may be any of layers including an amorphous silicon layer and a silicon oxide layer to improve adhesion between neighboring layers, and the second barrier layer 104 may be a silicon oxide layer. In an embodiment, each of the first barrier layer 102 and the second barrier layer 104 may have a thickness between about 4000 Å and about 7000 Å, but embodiments are not limited thereto.

In an embodiment, a buffer layer may be further formed on the substrate 100. The buffer layer may block impurities or moisture from penetrating through the substrate 100. For example, the buffer layer may include an inorganic material, such as $SiO_x$, $SiN_x$, silicon oxynitride ($SiO_xN_y$), aluminum oxide ($Al_2O_3$), aluminum nitride (AlN), titanium oxide ($TiO_2$), or titanium nitride (TiN), or an organic material, such as PI, polyester, or acrylic, and may have a stack structure including any of the aforementioned materials. In some embodiments, the second barrier layer 104 of the substrate 100 may be a part of the buffer layer having a multilayer structure.

The thin film transistor 210 is disposed in the display area DA of the substrate 100, and the display device electrically connected to the thin film transistor 210 is disposed in addition to the thin film transistor 210. FIG. 2 illustrates the organic light-emitting device 300 as the display device. In the first non-display area PA1 of the substrate 100, a thin film transistor (not illustrated) may be disposed. The thin film transistor disposed in the first non-display area PA1 may be a portion of a circuit unit for controlling electrical signals transmitted to, for example, the display area DA.

The thin film transistor 210 includes a semiconductor layer 211 including amorphous silicon, polycrystalline silicon, or an organic semiconductor material, a gate electrode 213, a source electrode 215, and a drain electrode 217. When the buffer layer is disposed on the substrate 100, the semiconductor layer 211 may be on the buffer layer.

The gate electrode 213 is disposed above the semiconductor layer 211, and in response to a signal transmitted to the gate electrode 213, the source electrode 215 and the drain electrode 217 are electrically connected to each other. In an embodiment, the gate electrode 213 may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may have a single-layer structure or a multilayer structure. In this case, to secure insulation between the semiconductor layer 211 and the gate electrode 213, a first inorganic insulating layer 120 may be disposed between the semiconductor layer 211 and the gate electrode 213, the first inorganic insulating layer 120 including an inorganic material, such as $SiO_x$, $SiN_x$, or $SiO_xN_y$. The first inorganic insulating layer 120 may be formed over the display area DA, the first non-display area PA1, and the second non-display area PA2.

A second inorganic insulating layer 130 may be disposed on the gate electrode 213 and may include a layer or layers including an inorganic material, such as $SiO_x$, $SiN_x$, or $SiO_xN_y$. The second inorganic insulating layer 130 may be formed over the display area DA, the first non-display area PA1, and the second non-display area PA2.

The source electrode 215 and the drain electrode 217 are disposed on the second inorganic insulating layer 130. The source electrode 215 and the drain electrode 217 are electrically connected to the semiconductor layer 211, respectively, through contact holes formed in the second inorganic insulating layer 130 and the first inorganic insulating layer 120. In an embodiment, the source electrode 215 and the drain electrode 217 may each include at least one of Al, Pt, Pd, Ag, Mg, Au, Ni, Nd, Ir, Cr, Li, Ca, Mo, Ti, W, and Cu, considering the conductivity, etc., and may have a single-layer structure or a multilayer structure.

To protect the thin film transistor 210 having the above structure, etc., a protection layer (not illustrated) covering the thin film transistor 210 may be disposed. The protection layer may include, for example, an inorganic material, such as $SiO_x$, $SiN_x$, or $SiO_xN_y$. The protection layer may include a layer or layers.

A planarization layer 140 may be disposed on the thin film transistor 210. As illustrated in FIG. 2, for example, when the organic light-emitting device 300 may be disposed at a higher level than the thin film transistor 210, the planarization layer 140 may cover the thin film transistor 210 and may flatten unevenness caused by the thin film transistor 210. The planarization layer 140 may include, for example, an organic insulating material, such as acrylic, benzocyclobutene (BCB), or hexamethyldisiloxane (HMDSO). FIG. 2 illustrates that the planarization layer 140 is a single layer; however, the planarization layer 140 may be multiple layers. The display apparatus 10 according to an embodiment may include both the protection layer and the planarization layer 140, or may include only the planarization layer 140.

The organic light-emitting device 300 is disposed on the planarization layer 140 in the display area DA, the organic light-emitting device 300 including the pixel electrode 310, an opposite electrode 330, and an intermediate layer 320 disposed therebetween and including an emission layer.

An opening, which exposes at least one of the source electrode 215 and the drain electrode 217 of the thin film transistor 210, is formed in the planarization layer 140, and, on the planarization layer 140, there is the pixel electrode 310 contacting any one of the source electrode 215 and the drain electrode 217 and electrically connected to the thin film transistor 210 through the opening.

The pixel electrode 310 may include a transparent (or translucent) electrode or a reflective electrode. When the pixel electrode 310 includes a transparent (or translucent) electrode, the pixel electrode 310 may include, for example, ITO, IZO, ZnO, $In_2O_3$, IGO, or AZO. When the pixel electrode 310 includes a reflective electrode, the pixel electrode 310 may include a reflection layer including any of Ag, Mg, Al, Pt, Pd, Au, Ni, Nd, Ir, Cr, and a combination thereof, and a layer including ITO, IZO, ZnO, $In_2O_3$, IGO, or AZO. However, embodiments are not limited thereto, and the pixel electrode 310 may include any of various materials and may have any of various structures such as a single-layer structure and a multilayer structure.

A pixel-defining layer 150 may be disposed on the planarization layer 140. The pixel-defining layer 150 defines pixels as the pixel-defining layer 150 has an opening corresponding to each sub-pixel, that is, an opening exposing at least a central portion of the pixel electrode 310. Also, as illustrated in FIG. 2, the pixel-defining layer 150 prevents or substantially prevents arcs, etc. from being generated at edges of the pixel electrode 310 by increasing a distance between the edges of the pixel electrode 310 and the opposite electrode 330 above the pixel electrode 310. The pixel-defining layer 150 may include, for example, an organic insulating material, such as PI or HMDSO.

The intermediate layer 320 of the organic light-emitting device 300 includes the emission layer. The emission layer may include a polymer organic material or a low-molecular weight organic material emitting light of a certain color. Also, the intermediate layer 320 may include at least one functional layer from among a hole transport layer (HTL), a hole injection layer (HIL), an electron transport layer (ETL), and an electron injection layer (EIL). Such a functional layer may include an organic material. Some of layers forming the intermediate layer 320, for example, the functional layer(s), may be integrally formed over the organic light-emitting devices 300.

The opposite electrode 330 may cover the display area DA. In an embodiment, the opposite electrode 330 may be integrally formed with the organic light-emitting devices 300 and may correspond to the pixel electrodes 310. The opposite electrode 330 may include a transparent (or translucent) electrode or a reflective electrode. In an embodiment, when the opposite electrode 330 includes a transparent (or translucent) electrode, the opposite electrode 330 may include a layer including a metal having a small work function, that is, any of Li, Ca, lithium fluoride (LiF)/Ca, LiF/Al, Al, Ag, Mg, and a combination thereof, and a transparent (translucent) conductive layer including ITO, IZO, ZnO, $In_2O_3$, or the like. When the opposite electrode 330 includes a reflective electrode, the opposite electrode 330 may include a layer including any of Li, Ca, LiF/Ca, LiF/Al, Al, Ag, Mg, and a combination thereof. However, structures and materials of the opposite electrode 330 are not limited thereto and may be varied.

Meanwhile, in order for the display apparatus 10 to display an image, an electrical signal (e.g., a preset electrical signal) is to be applied to the opposite electrode 330. To this end, a voltage line 420 is aligned in the first non-display area PA1 to transmit the electrical signals (e.g., preset electrical signals) to the opposite electrode 330. The voltage line 420 may be a common power voltage ELVSS line.

When various conductive layers are formed in the display area DA, the voltage line 420 and the conductive layers may be concurrently (e.g., simultaneously) formed of a same material. FIG. 2 illustrates that the voltage line 420 is disposed on the second inorganic insulating layer 130 in the first non-display area PA1 like the source electrode 215 and the drain electrode 217 of the thin film transistor 210 are disposed on the second inorganic insulating layer 130 in the display area DA. In an embodiment, when the source electrode 215 and the drain electrode 217 of the thin film transistor 210 are formed on the second inorganic insulating layer 130 in the display area DA, the voltage line 420 is concurrently (e.g., simultaneously) formed of a same material on the second inorganic insulating layer 130 in the first non-display area PA1. Accordingly, the voltage line 420 may have a same structure as the source electrode 215 and the drain electrode 217. However, embodiments are not limited thereto and may be embodied in various forms such as an example in which, when the gate electrode 213 is formed, the voltage line 420 is formed on the first inorganic insulating layer 120 concurrently (e.g., simultaneously) with the gate electrode 213 of a same material.

The opposite electrode 330 may directly contact the voltage line 420, or, as illustrated in FIG. 2, the opposite electrode 330 may be electrically connected to the voltage line 420 through a protection conductive layer 421. The protection conductive layer 421 may be disposed on the planarization layer 140 and may extend onto the voltage line 420, thereby being electrically connected to the voltage line 420. Accordingly, the opposite electrode 330 may contact the protection conductive layer 421 in the first non-display area PA1, and the protection conductive layer 421 may also contact the voltage line 420 in the first non-display area PA1.

As illustrated in FIG. 2, the protection conductive layer 421 is disposed on the planarization layer 140, and, thus, the protection conductive layer 421 may be concurrently (e.g., simultaneously) formed of a same material as a component located on the planarization layer 140 in the display area DA. In an embodiment, when the pixel electrode 310 is formed on the planarization layer 140 in the display area DA, the protection conductive layer 421 may be concurrently (e.g., simultaneously) formed of a same material as the pixel electrode 310 on the planarization layer 140 in the first non-display area PA1. Accordingly, the protection conductive layer 421 may have a same structure as the pixel electrode 310. As illustrated in FIG. 2, the protection conductive layer 421 may cover a portion of the voltage line 420 that is not covered by the planarization layer 140 but is exposed. Thus, damage to the portion of the voltage line 420, which is exposed outside the planarization layer 140, may be prevented or substantially prevented during formation of a first restriction dam 610 or a second restriction dam 620.

To prevent or substantially prevent impurities, such as external oxygen or moisture, from penetrating into the display area DA through the planarization layer 140, as illustrated in FIG. 2, the planarization layer 140 may have an opening 140b in the first non-display area PA1. The opening 140b may surround the display area DA. In an embodiment, when the protection conductive layer 421 is formed, the protection conductive layer 421 may fill the opening 140b. Thus, the penetration of the impurities, which have penetrated into the planarization layer 140 in the first non-display area PA1, into the planarization layer 140 in the display area DA may be effectively prevented or substantially prevented.

A capping layer 160 improving the efficiency of light generated from the organic light-emitting device 300 may be located on the opposite electrode 330. The capping layer 160 may cover the opposite electrode 330 and may extend to an outer portion of the opposite electrode 330 to contact the protection conductive layer 421 disposed under the opposite electrode 330. As the opposite electrode 330 covers the display area DA and extends beyond the display area DA, the capping layer 160 may also cover the display area DA and extend to the first non-display area PA1 outside the display area DA. The capping layer 160 includes an organic material.

As described above, the capping layer 160 improves the efficiency of the light generated from the organic light-emitting device 300. For example, the capping layer 160 may improve the efficiency of light extraction to the outside. The increase in efficiency by using the capping layer 160 may be uniformly achieved in the display area DA. In an embodiment, the capping layer 160 has an upper surface corresponding to curves of an upper surface of a layer under the capping layer 160. That is, as illustrated in FIG. 2, the upper surface of the capping layer 160 may have a shape corresponding to curves of an upper surface of the opposite electrode 330 at a portion of the capping layer 160 disposed above the opposite electrode 330.

An encapsulation layer 500 is disposed above the capping layer 160. The encapsulation layer 500 protects the organic light-emitting device 300 from external moisture, oxygen, or the like. To this end, the encapsulation layer 500 extends to the first non-display area PA1 outside the display area DA. The encapsulation layer 500 may have a multilayer structure. In an embodiment, as illustrated in FIG. 2, the encapsulation layer 500 may include a first inorganic encapsulation layer 510, an organic encapsulation layer 520, and a second inorganic encapsulation layer 530.

The first inorganic encapsulation layer 510 may cover the capping layer 160 and may include $SiO_x$, $SiN_x$, $SiO_xN_y$, and/or the like.

Because the first inorganic encapsulation layer 510 is formed along a structure thereunder, an upper surface of the first inorganic encapsulation layer 510 may not be flat, as illustrated in FIG. 2. The organic encapsulation layer 520 may cover the first inorganic encapsulation layer 510 and have a sufficient thickness, and, thus, an upper surface of the organic encapsulation layer 520 may be substantially flat throughout the display area DA. In an embodiment, the organic encapsulation layer 520 may include polyethylene terephthalate, polyethylene naphthalate, polycarbonate, polyimide, polyethylene sulfonate, polyoxymethylene, polyarylate, hexamethyldisiloxane, acryl-based resin (for example, poly(methyl methacrylate, polyacrylic acid, etc.), or any combination thereof.

The second inorganic encapsulation layer 530 covers the organic encapsulation layer 520 and may include silicon oxide, silicon nitride and/or silicon oxynitride, or the like. The second inorganic encapsulation layer 530 may extend to an outer portion of the organic encapsulation layer 520 and may contact the first inorganic encapsulation layer 510, thereby preventing the organic encapsulation layer 520 from being exposed to the outside.

In an embodiment, because the encapsulation layer 500 includes the first inorganic encapsulation layer 510, the organic encapsulation layer 520, and the second inorganic encapsulation layer 530, although cracks appear in the encapsulation layer 500, such cracks may not be developed between the first inorganic encapsulation layer 510 and the organic encapsulation layer 520 or between the organic encapsulation layer 520 and the second inorganic encapsulation layer 530 due to the multilayer structure of the encapsulation layer 500. Therefore, formation of a path, through which external moisture, oxygen, or the like penetrates into the display area DA, may be prevented or reduced.

Structures under the encapsulation layer 500 may be damaged while the encapsulation layer 500 is formed. For example, the first inorganic encapsulation layer 510 may be formed by using chemical vapor deposition, and when the first inorganic encapsulation layer 510 is formed by using chemical vapor deposition, a layer directly under the first inorganic encapsulation layer 510 may be damaged. Therefore, when the first inorganic encapsulation layer 510 is formed directly on the capping layer 160, the capping layer 160 improving the efficiency of the light generated from the organic light-emitting device 300 may be damaged, and, thus, the light efficiency of the display apparatus may be degraded. Thus, according to an embodiment, a protection layer 170 may be disposed between the capping layer 160 and the encapsulation layer 500 to prevent or substantially prevent the capping layer 160 from being damaged during the formation of the encapsulation layer 500. In an embodiment, the protection layer 170 may include LiF.

As described above, the capping layer 160 may extend to the first non-display area PA1 outside the display area DA as well as the display area DA. Accordingly, the protection layer 170 may extend to the outside of the capping layer 160 and prevent or substantially prevent direct contact of the capping layer 160 with the encapsulation layer 500. In this case, the protection layer 170 covers an end portion 160a of the capping layer 160, and, thus, an end portion 170a of the protection layer 170 is disposed on the planarization layer 140. In an embodiment, as illustrated in FIG. 2, the end portion 170a of the protection layer 170 directly contacts the protection conductive layer 421 on the planarization layer 140.

Therefore, because the first inorganic encapsulation layer 510, which is the lowermost layer of the encapsulation layer 500, does not contact the capping layer 160 including an organic material, but contacts the protection layer 170 including an inorganic material, such as LiF, adhesion between the encapsulation layer 500 and the layer thereunder may remain great. Thus, while the display apparatus 10 is manufactured or used after the manufacture, exfoliation of the encapsulation layer 500 from the lower layer may be effectively prevented or reduced.

When the encapsulation layer 500 is formed, and, in further detail, when the organic encapsulation layer 520 is formed, a material for forming the organic encapsulation layer 520 is limited to be within a region (e.g., a predetermined region). To this end, as illustrated in FIG. 2, the first restriction dam 610 may be disposed in the first non-display area PA1. In particular, as illustrated in FIG. 2, the first inorganic insulating layer 120, the second inorganic insulating layer 130, and the planarization layer 140 may be disposed not only in the display area DA of the substrate 100 but also in the first non-display area PA1. The first restriction dam 610 is disposed in the first non-display area PA1 to be apart from the planarization layer 140.

In an embodiment, the first restriction dam 610 may have a multilayer structure. That is, the first restriction dam 610 may include a first layer 611 and a second layer 613 in a direction away from a portion close to the substrate 100. In an embodiment, the first layer 611 and the planarization layer 140 may be concurrently (e.g., simultaneously) formed of a same material as the planarization layer 140 that is formed in the display area DA, and the second layer 613 and the pixel-defining layer 150 may be concurrently (e.g., simultaneously) formed of a same material as the pixel-defining layer 150 that is formed in the display area DA.

As illustrated in FIG. 2, in addition to the first restriction dam 610, the second restriction dam 620 may be between the first restriction dam 610 and the end portion 140a of the planarization layer 140. The second restriction dam 620 may be on a portion of the protection conductive layer 421 on the voltage line 420. In an embodiment, the second restriction dam 620 is apart from the planarization layer 140 and disposed in the first non-display area PA1. In an embodiment, the second restriction dam 620 may have a multilayer structure like the first restriction dam 610 and may include a smaller number of layers than the first restriction dam 610, and, thus, a height of the second restriction dam 620 from the substrate 100 is less than that of the first restriction dam 610. In an embodiment, as illustrated in FIG. 2, the second restriction dam 620 and the second layer 613 of the first restriction dam 610 are concurrently (e.g., simultaneously) formed of a same material.

Therefore, a location of the organic encapsulation layer 520 is limited by the second restriction dam 620, and, thus, the second restriction dam 620 may prevent or substantially prevent a material for forming the organic encapsulation layer 520 from overflowing towards an outer portion of the second restriction dam 620 during the formation of the second restriction dam 620. Even if the material for forming the organic encapsulation layer 520 partially overflows towards the outer portion of the second restriction dam 620, the location of the organic encapsulation layer 520 is limited by the first restriction dam 610, and, thus, the material for forming the organic encapsulation layer 520 may not move in a direction of an edge 100a of the substrate 100. In an embodiment, the first inorganic encapsulation layer 510 and the second inorganic encapsulation layer 530, which are formed by using chemical vapor deposition, cover the first and second restriction dams 610 and 620 and are formed to an outer portion of the first restriction dam 610, as illustrated in FIG. 2.

As illustrated in FIG. 2, a crack prevention portion 630 is disposed in the first non-display area PA1. The crack prevention portion 630 may extend along at least some portions of the edge 100a of the substrate 100. For example, the crack prevention portion 630 may have a shape circling or extending around the display area DA once. In an embodiment, in some regions, the crack prevention portion 630 may be discontinuous. The crack prevention portion 630 may prevent or substantially prevent cracks from spreading into the display area DA, the cracks appearing in the first and second inorganic insulating layers 120 and 130 including inorganic materials due to impacts, etc. that may be caused when a mother board is cut during the manufacture of the display apparatus 10 or when the display apparatus 10 is used.

The crack prevention portion 630 may have any of various shapes, and, in an embodiment, as illustrated in FIG. 2, the crack prevention portion 630 and some components formed in the display area DA may be concurrently (e.g., simultaneously) formed of a same material, and the crack prevention portion 630 may also have a multilayer structure. FIG. 2 illustrates that the crack prevention portion 630 has a multilayer structure including a lower layer 630' and an upper layer 630" disposed on the lower layer 630'. In further detail, FIG. 2 illustrates that, in an embodiment, the crack prevention portion 630 includes the lower layer 630' including a same material as the first inorganic insulating layer 120, and the upper layer 630" including a same material as the second inorganic insulating layer 130 disposed on the first inorganic insulating layer 120. In an embodiment, when the buffer layer is formed on the substrate 100, the crack prevention portion 630 may include a layer including a same material as the buffer layer. In an embodiment, as illustrated in FIG. 2, there may be multiple crack prevention portions 630 that are apart from each other.

The crack prevention portion 630 described above may be formed as the first inorganic insulating layer 120 and the second inorganic insulating layer 130 are partially removed. That is, as illustrated in FIG. 2, grooves, from which the first inorganic insulating layer 120 and the second inorganic insulating layer 130 are removed, are formed in at least one side of the crack prevention portion 630, and the crack prevention portion 630 may include remaining portions of the first inorganic insulating layer 120 and the second inorganic insulating layer 130 that are adjacent to the grooves.

As illustrated in FIG. 2, the crack prevention portion 630 may be covered by a cover layer 650. In an embodiment, for example, the cover layer 650 and the planarization layer 140 may be concurrently (e.g., simultaneously) formed of a same material when the planarization layer 140 is formed in the display area DA. That is, the cover layer 650 may include a layer including an organic material, the layer covering the crack prevention portion 630 that includes an inorganic material. The cover layer 650 may cover end portions of the first inorganic insulating layer 120 and/or the second inorganic insulating layer 130 in the direction of the edge 100*a* of the substrate 100 and may also cover the crack prevention portion 630.

Figure 3:
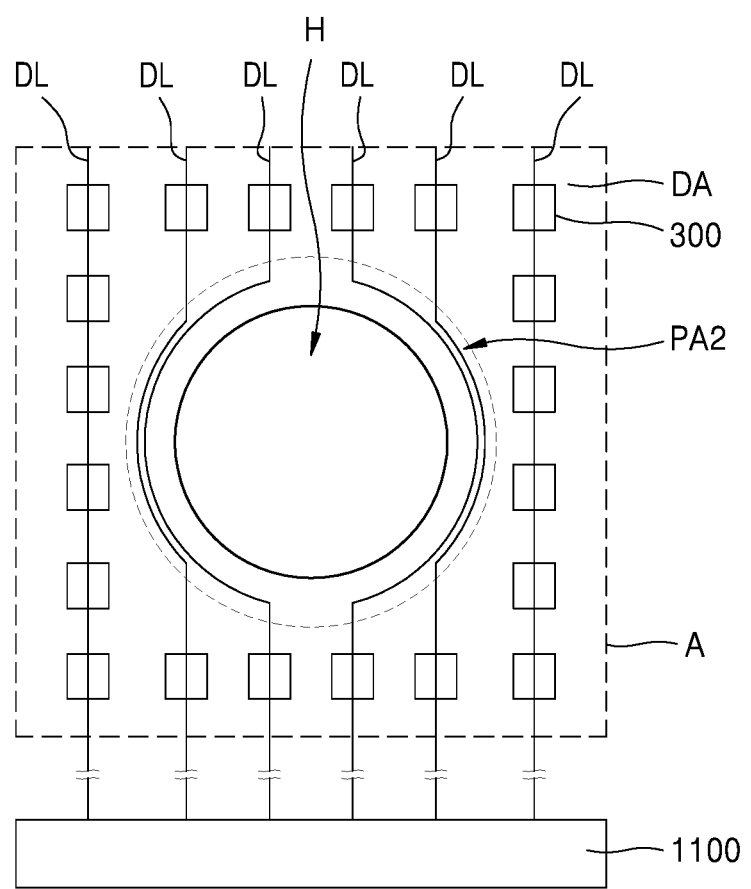
FIG. 3 is an enlarged plan view of a region "A" of the display apparatus of FIG. 1.
Figure 4:
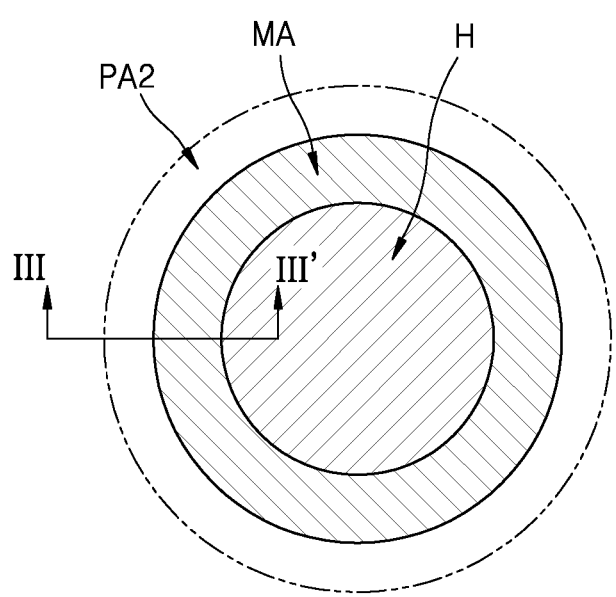
FIG. 4 is a schematic plan view of a through portion of FIG. 3 according to an example embodiment.
Figure 5:
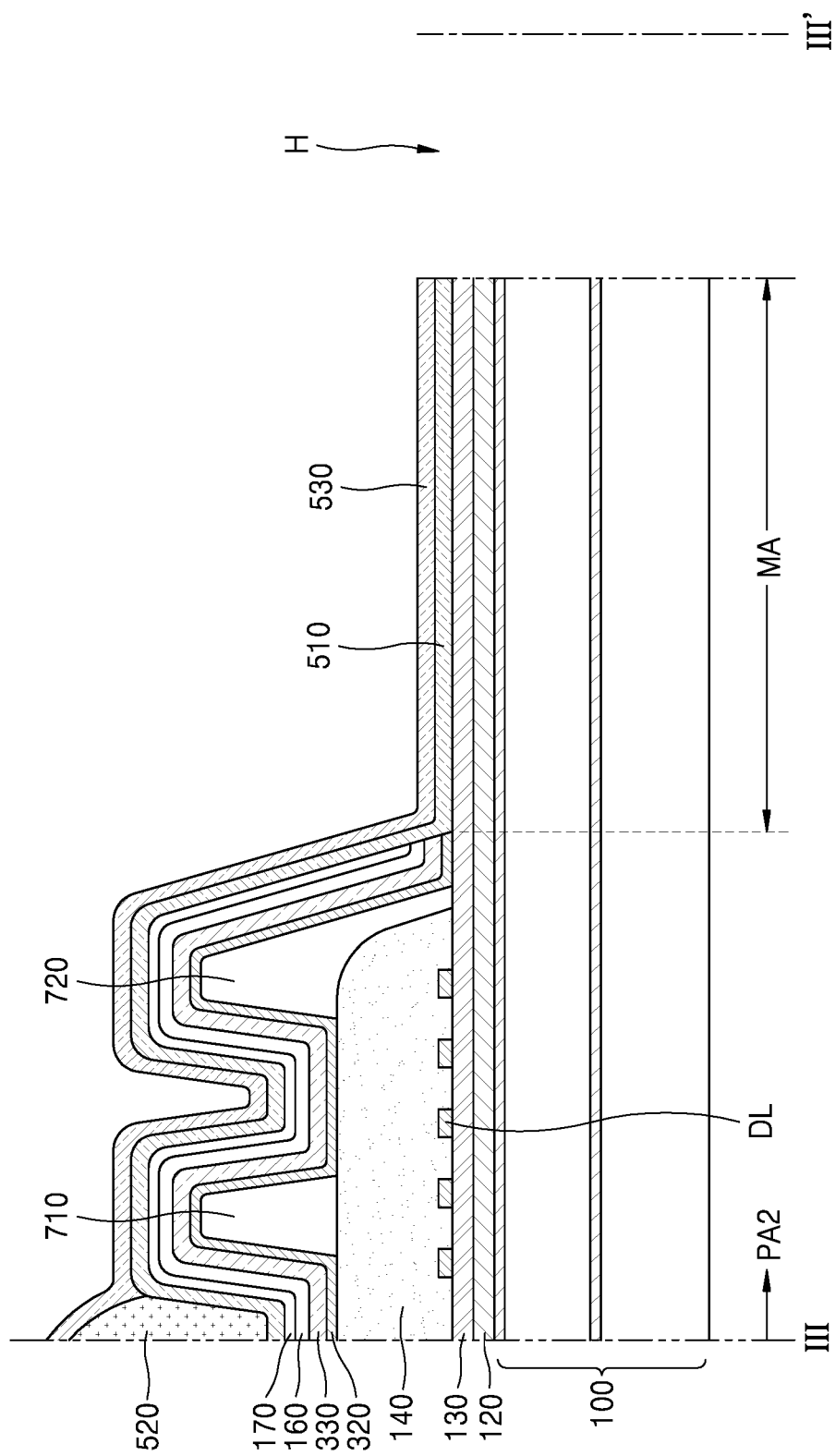
FIG. 5 is a schematic cross-sectional view of the through portion of FIG. 4, taken along the line III-III' of FIG. 4.
Figure 6:
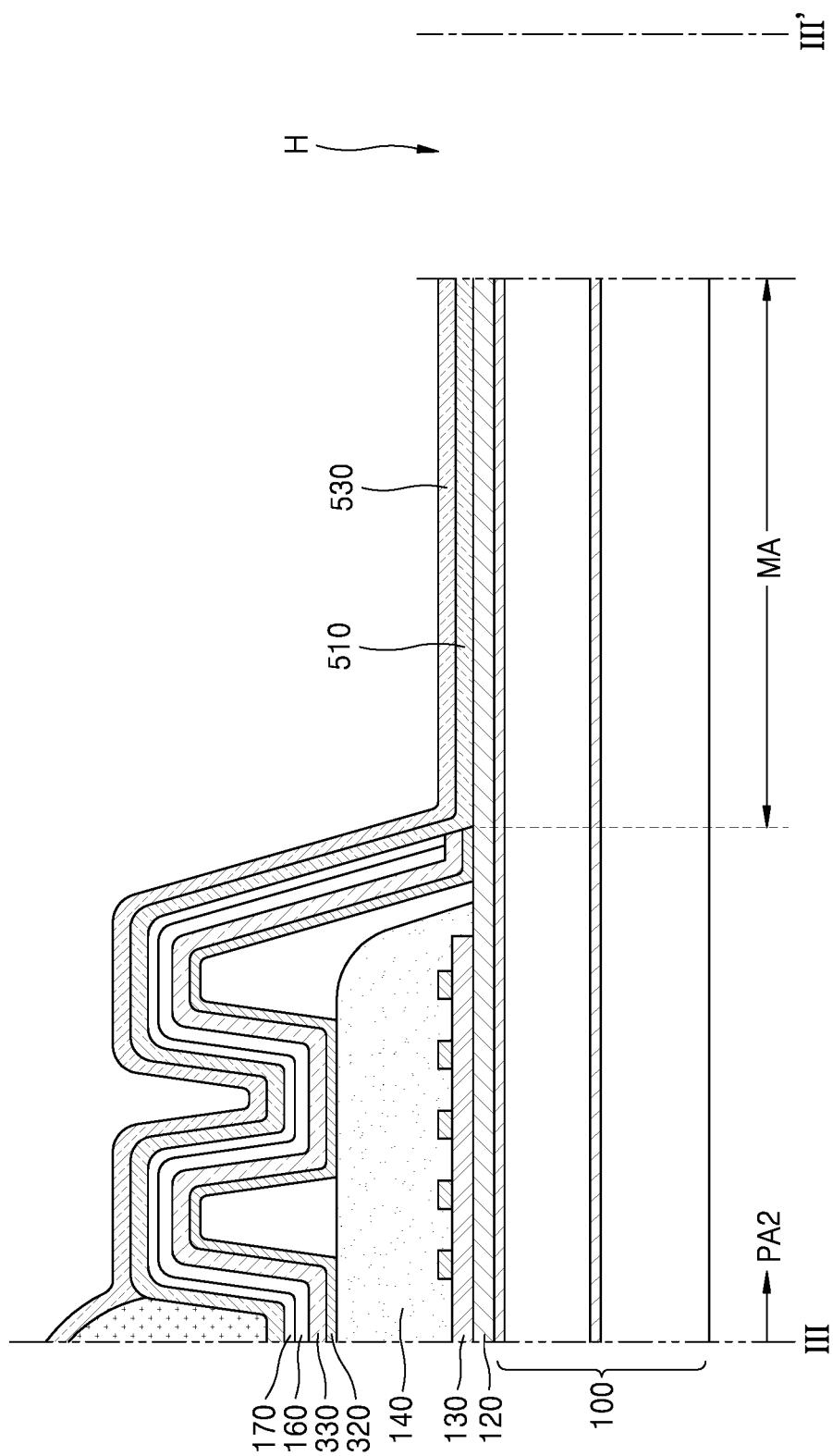
FIG. 6 is a schematic cross-sectional view of a through portion, taken along the line III-III' of FIG. 4, according to another example embodiment.
Figure 7:
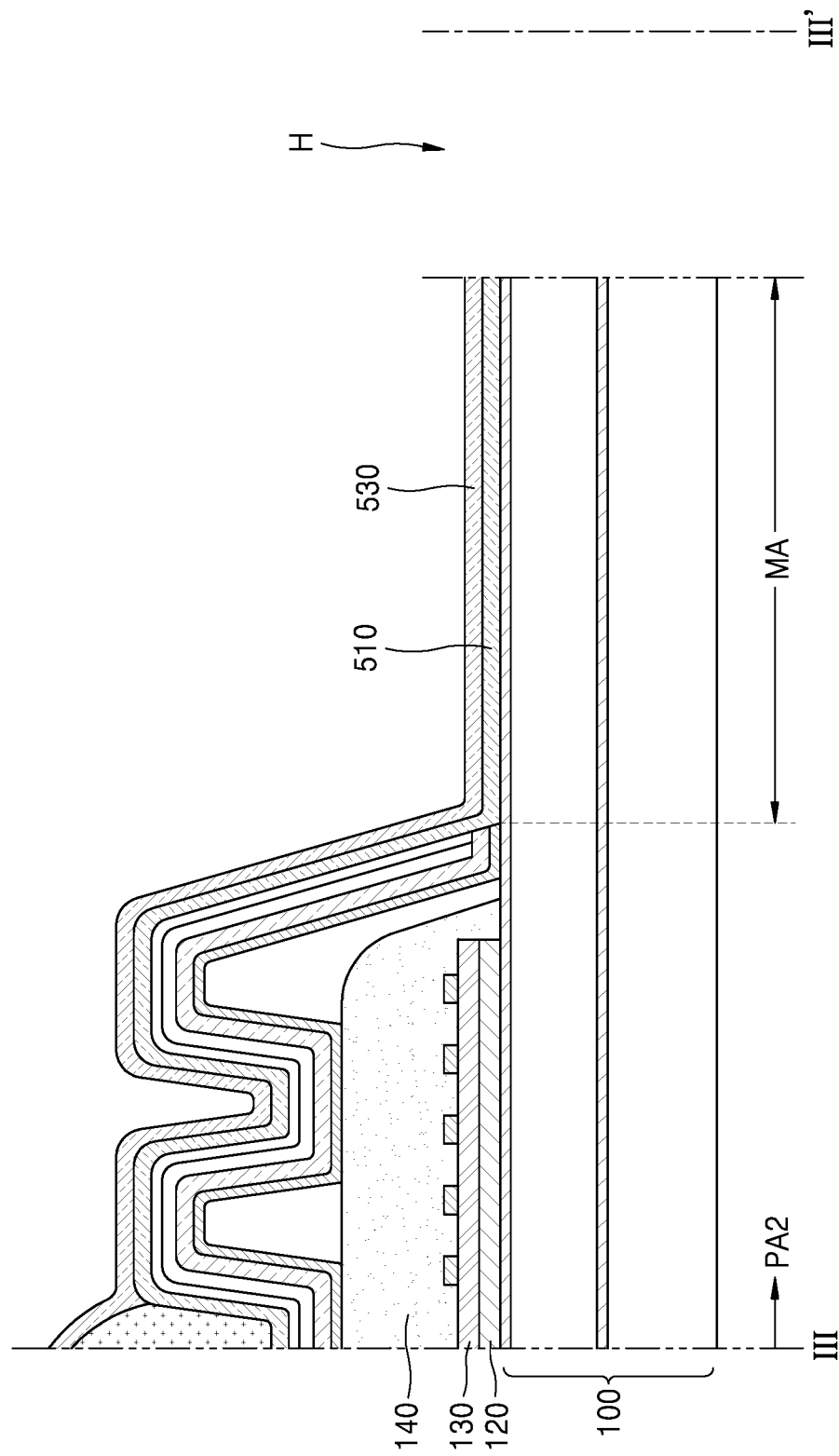
FIG. 7 is a schematic cross-sectional view of a through portion, taken along the line III-III' of FIG. 4, according to another example embodiment.

FIG. 3 is an enlarged plan view of a region "A" of FIG. 1; FIG. 4 is a schematic plan view of a through portion of FIG. 3, according to an example embodiment; and FIG. 5 is a schematic cross-sectional view taken along the line III-III' of FIG. 4, according to an example embodiment. FIGS. 6 and 7 are cross-sectional views of a through portion taken along the line III-III' of FIG. 4, according to other example embodiments.

FIG. 3 schematically illustrates the through portion H and surroundings of the through portion H. Referring to FIG. 3, the organic light-emitting devices 300 electrically connected to the data lines DL are arranged in the display area DA around the through hole H, and the second non-display area PA2 may be defined as an area which is between the through portion H and the display area DA and where images are not displayed.

The data lines DL extend in a first direction and are electrically connected to a data driver 1100. In an example, the data driver 1100 is of a chip-on-panel (COP) type and may be disposed in the first non-display area (PA1 of FIG. 1) or on a flexible printed circuit board (FPCB) (not illustrated) electrically connected to a terminal disposed in the first non-display area.

Some of the data lines DL extending in the first direction may not be straight along the first direction due to the through portion H disposed in the display area DA. In this case, some of the data lines DL bypass the through portion H, and the data lines DL bypassing the through portion H are disposed in the second non-display area PA2 around the through portion H.

Although not illustrated in FIG. 3, scan lines may extend in a second direction crossing the data lines DL, and some of the scan lines may bypass the through portion H in an area where the through portion H is formed. As another example, the display apparatus (10 of FIG. 1) includes two scan drivers arranged on both sides of the display area DA and thus may prevent the scan lines from bypassing the through portion H. For example, the scan lines, which are electrically connected to the organic light-emitting devices 300 on the left side of the through hole H, and the scan lines, which are electrically connected to the organic light-emitting devices 300 on the right side of the through hole H, may be connected to different scan drivers.

Referring to FIGS. 4 and 5 that illustrate the through portion H in further detail, the moat area MA surrounding the through portion H may be located around the through portion H vertically penetrating the substrate 100. The moat area MA is within the second non-display area PA2.

In the second non-display area PA2, some of the data lines DL may be arranged. For example, in the second non-display area PA2, the data lines DL are above the second inorganic insulating layer 130 and may be covered by the planarization layer 140.

A first internal dam 710 may be disposed on the planarization layer 140 in the second non-display area PA2, and a second internal dam 720 that is apart from the first internal dam 710 may be further disposed. The second internal dam 720 may be on the planarization layer 140 between the first internal dam 710 and the through portion H.

In an embodiment, the first internal dam 710 and the second internal dam 720 may be concurrently (e.g., simultaneously) formed of a same material when the pixel-defining layer (150 of FIG. 2) is formed and may respectively surround the through portion H. The first internal dam 710 and the second internal dam 720 may perform a same function as the first restriction dam (610 of FIG. 2) and the second restriction dam (620 of FIG. 2). Therefore, the first internal dam 710 and the second internal dam 720 may prevent or substantially prevent the material for forming the organic encapsulation layer 520 from flowing towards the through portion H during the formation of the organic encapsulation layer 520, and, thus, the organic encapsulation layer 520 may be outside an area surrounded by the first internal dam 710. The second internal dam 720 may secondarily block the flow of the material for forming the organic encapsulation layer 520. The first inorganic encapsulation layer 510 and the second inorganic encapsulation layer 530 may extend towards the through portion H beyond the second internal dam 720.

The first internal dam 710 and the second internal dam 720 may overlap some of the data lines DL arranged in the second non-display area PA2, and, thus, an area of the second non-display area PA2 may be decreased.

In the second non-display area PA2, the first inorganic encapsulation layer 510 and the second inorganic encapsulation layer 530 directly contact each other, and the first inorganic encapsulation layer 510 directly contacts another inorganic layer thereunder. More specifically, the moat area MA surrounding the through portion H may be located in the second non-display area PA2. In an embodiment, in the moat area MA, there may be layers including only inorganic materials. In the moat area MA, the first inorganic encapsulation layer 510 and the second inorganic encapsulation layer 530 directly contact each other, and the first inorganic encapsulation layer 510 directly contacts another inorganic layer thereunder. For example, when the first inorganic insulating layer 120 and the second inorganic insulating layer 130 are formed by extending to the moat area MA, the first inorganic encapsulation layer 510 may directly contact the second inorganic insulating layer 130.

In another embodiment, as illustrated in FIG. 6, the first inorganic insulating layer 120 may extend to the moat area MA, and the second inorganic insulating layer 130 may be covered by the planarization layer 140 in the second non-display area PA2. In this case, the first inorganic encapsulation layer 510 may directly contact the first inorganic insulating layer 120 in the moat area MA.

In another embodiment, as illustrated in FIG. 7, both the first inorganic insulating layer 120 and the second inorganic insulating layer 130 may not extend to the moat area MA and may be covered by the planarization layer 140 in the second non-display area PA2. In this case, the first inorganic encapsulation layer 510 may directly contact an upper surface of the substrate 100 in the moat area MA. In an embodiment, in the moat area MA, the first inorganic encapsulation layer 510 may directly contact the second barrier layer (104 of FIG. 2). In an embodiment, when the buffer layer is further formed on the substrate 100, the first inorganic encapsulation layer 510 may directly contact the buffer layer in the moat area MA.

Therefore, the penetration of external moisture, etc. into the display area through side cross-sections of the display apparatus (10 of FIG. 1), which are exposed by the through portion H, may be effectively prevented by the moat area MA.

According to the related art, grooves, which surround the through portion H and are apart from each other, may be formed in a depthwise direction of the substrate 100, and the intermediate layer 320 may become discontinuous due to the grooves, to prevent the penetration of moisture through the through portion H. However, a great number of grooves have to be formed to improve the penetration prevention, and, thus, an area of the second non-display area PA2 is increased. For example, when 20 grooves surrounding the through portion H are formed, a length of an area, where the grooves are located, is about 300 μm, but when the display apparatus (10 of FIG. 1) according to one or more embodiments of the present disclosure includes the moat area MA, a length of the moat area MA may be less than or equal to 100 μm. The length of the area where the existing grooves are located and the length of the moat area MA according to the present disclosure both indicate a length measured in a radius direction of a circle having the through portion H at the center thereof. That is, according to one or more embodiments of the present disclosure, great penetration prevention may be achieved by the moat area MA, and the area of the second non-display area PA2 may be decreased.

Also, because the first inorganic encapsulation layer 510 directly contacts another inorganic layer thereunder in the moat area MA, exfoliation of the encapsulation layer (500 of FIG. 2), which is caused while the display apparatus (10 of FIG. 1) is manufactured or used after the manufacture, may be effectively prevented.

FIGS. 8 to 11 are schematic cross-sectional views of manufacturing processes of the display apparatus of FIG. 1, and illustrate the cross-sections respectively taken along the line I-I' of FIG. 1 and the line III-III' of FIG. 4.

Figure 8:
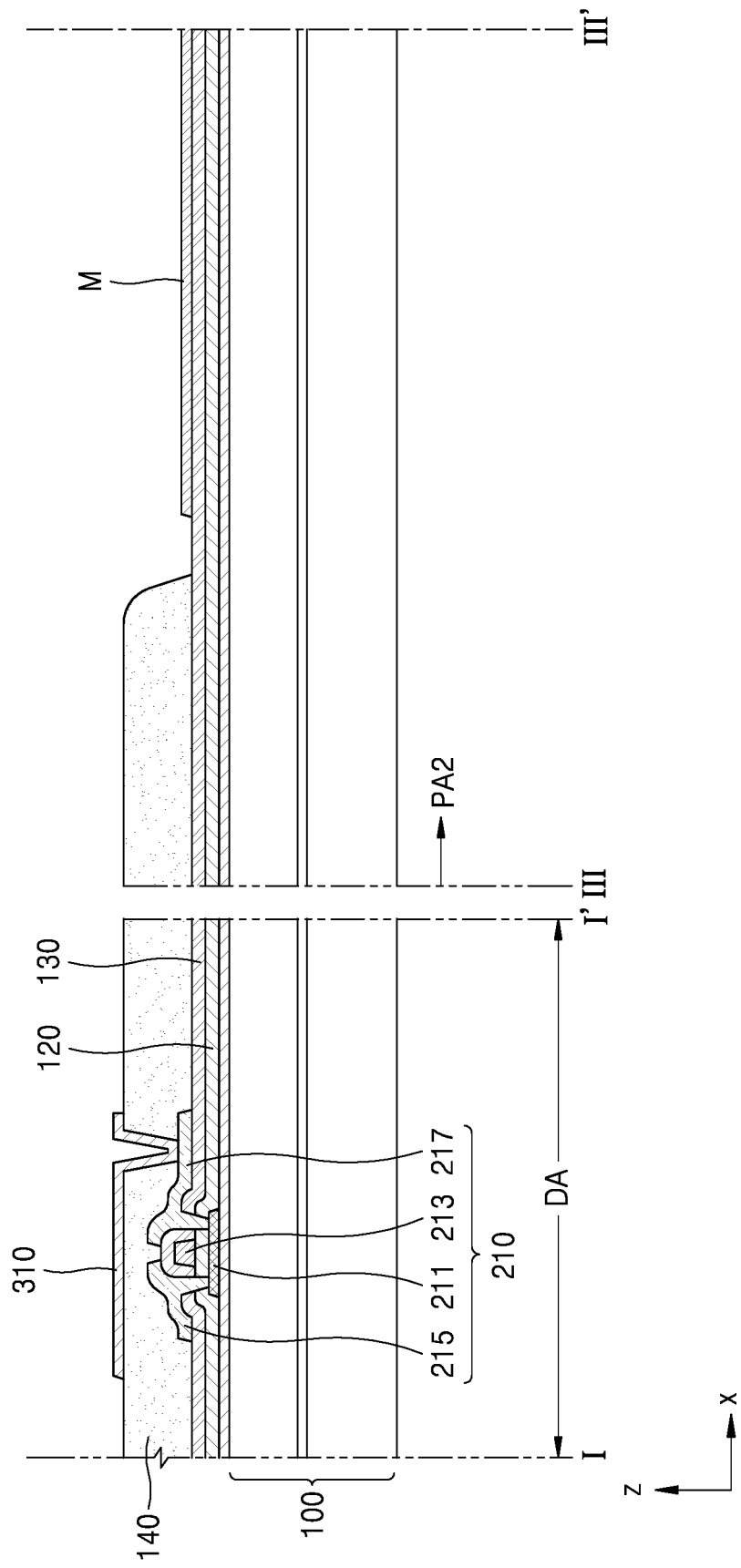
FIGS. 8 to 11 are schematic cross-sectional views of manufacturing processes of a display apparatus according to an example embodiment.

Referring to FIG. 8, the thin film transistor 210 and the planarization layer 140 covering the thin film transistor 210 are formed above the substrate 100. For example, the thin film transistor 210 may be in the display area DA, and the planarization layer 140 may extend to a part of the second non-display area PA2.

The thin film transistor 210 may include the semiconductor layer 211, the gate electrode 213, the source electrode 215, and the drain electrode 217, the first inorganic insulating layer 120 including an inorganic material may be formed between the semiconductor layer 211 and the gate electrode 213, and the first inorganic insulating layer 120 may be formed over the display area DA, the first non-display area (PA1 of FIG. 1), and the second non-display area PA2. Also, the second inorganic insulating layer 130, which is formed between the gate electrode 213 and the source electrode 215 and between the gate electrode 213 and the drain electrode 217, includes an inorganic material, and the second inorganic insulating layer 130 may extend to the first non-display area (PA1 of FIG. 1) and the second non-display area PA2.

An opening exposing the drain electrode 217 is formed in the planarization layer 140, and the pixel electrode 310 is formed on the planarization layer 140. The pixel electrode 310 may be formed by forming, on the substrate 100, a metallic material for forming the pixel electrode 310 and then patterning the same. The pixel electrode 310 may contact the drain electrode 217 through the opening.

When the pixel electrode 310 is formed, a metal layer M may also be formed in the second non-display area PA2. In an embodiment, the metal layer M may include a same material as the pixel electrode 310. The metal layer M may be formed in a central portion of the second non-display area PA2 and may be spaced a certain distance from an end portion of the planarization layer 140 extending to the second non-display area PA2.

In an embodiment, the metal layer M may be formed while the thin film transistor 210 is formed. For example, the metal layer M may be concurrently (e.g., simultaneously) formed with the gate electrode 213 or with the source electrode 215 and the drain electrode 217. In an embodiment, the metal layer M may be concurrently (e.g., simultaneously) formed with the semiconductor layer 211.

When the metal layer M is concurrently (e.g., simultaneously) formed with the semiconductor layer 211, the metal layer M may be directly formed on the substrate 100, and when the metal layer M is concurrently (e.g., simultaneously) formed with the gate electrode 213, the metal layer M may be formed on the substrate 100 or the first inorganic insulating layer 120, and when the metal layer M is concurrently (e.g., simultaneously) formed with the source electrode 215 and the drain electrode 217, the metal layer M may be formed on the substrate 100, the first inorganic insulating layer 120, or the second inorganic insulating layer 130.

Figure 9:
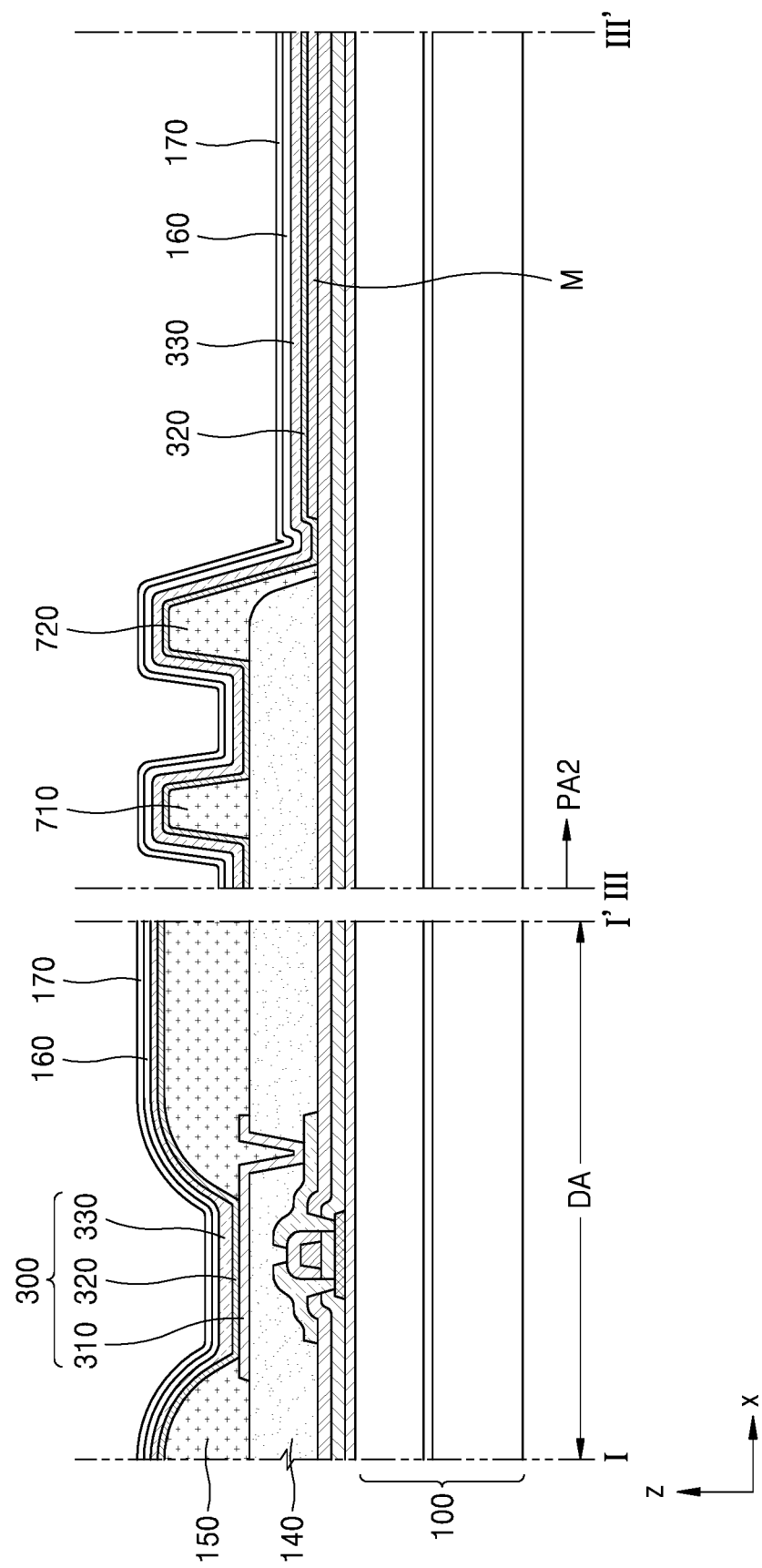

Then, as illustrated in FIG. 9, the pixel-defining layer 150 is formed on the pixel electrode 310. The pixel-defining layer 150 may cover edges of the pixel electrode 310 and may include an opening exposing a central portion of the pixel electrode 310. During the formation of the pixel-defining layer 150, the first internal dam 710 may be formed in the second non-display area PA2. In an embodiment, the second internal dam 720 may be formed together with the first internal dam 710. The first internal dam 710 and the second internal dam 720 may be disposed on the planarization layer 140 in the second non-display area PA2.

The organic light-emitting device 300 is formed by stacking the intermediate layer 320 and the opposite electrode 330 on the pixel electrode 310 exposed through the opening of the pixel-defining layer 150. In an embodiment, at least some layers included in the intermediate layer 320 may be integrally formed in the display area DA and the entire second non-display area PA2. In an embodiment, the opposite electrode 330 and the capping layer 160 and the protection layer 170, which may be formed on the opposite electrode 330, may also be integrally formed in the display area DA and the entire second non-display area PA2. Therefore, the intermediate layer 320 or some layers included in the intermediate layer 320, the opposite electrode 330, the capping layer 160, and the protection layer 170 may be sequentially stacked on the metal layer M in the second non-display area PA2.

Figure 10:
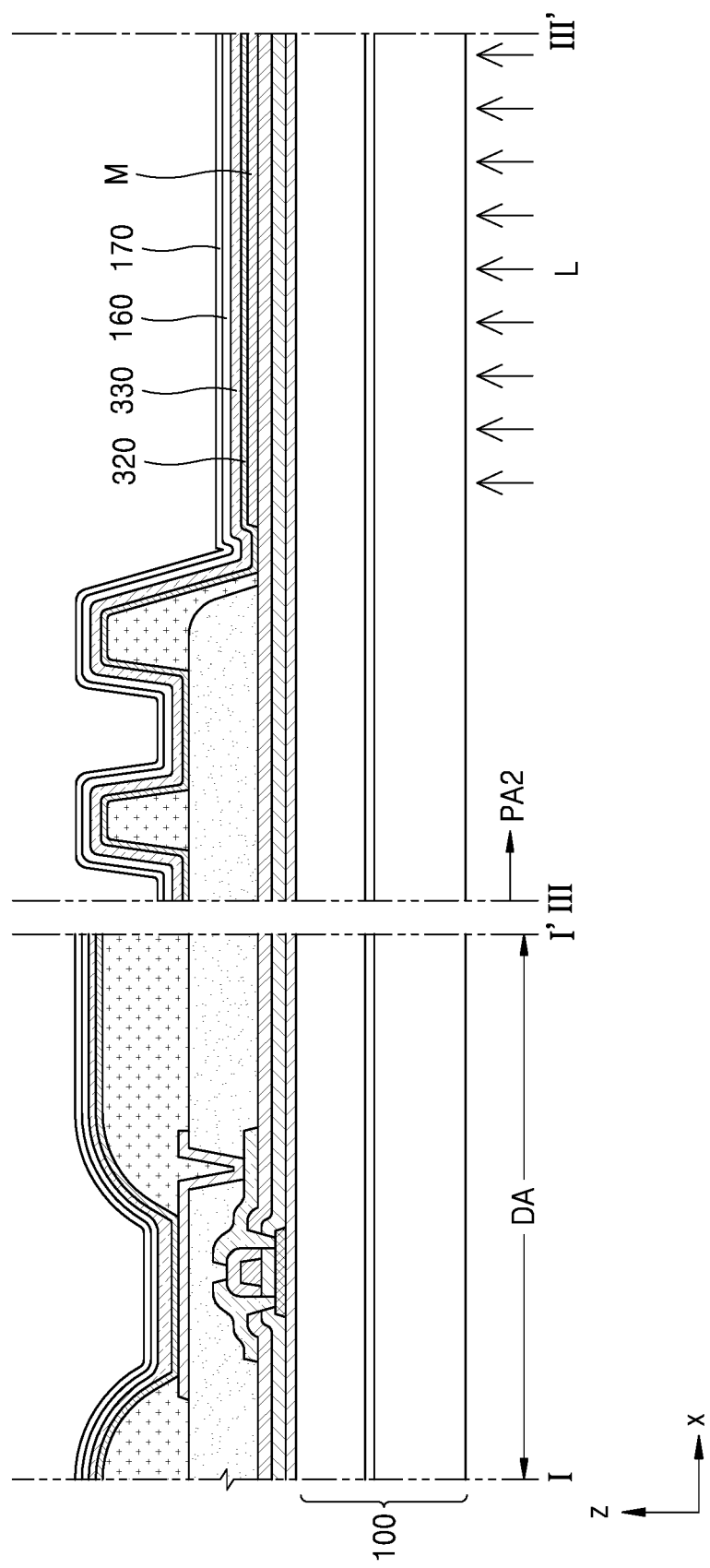
Figure 11:
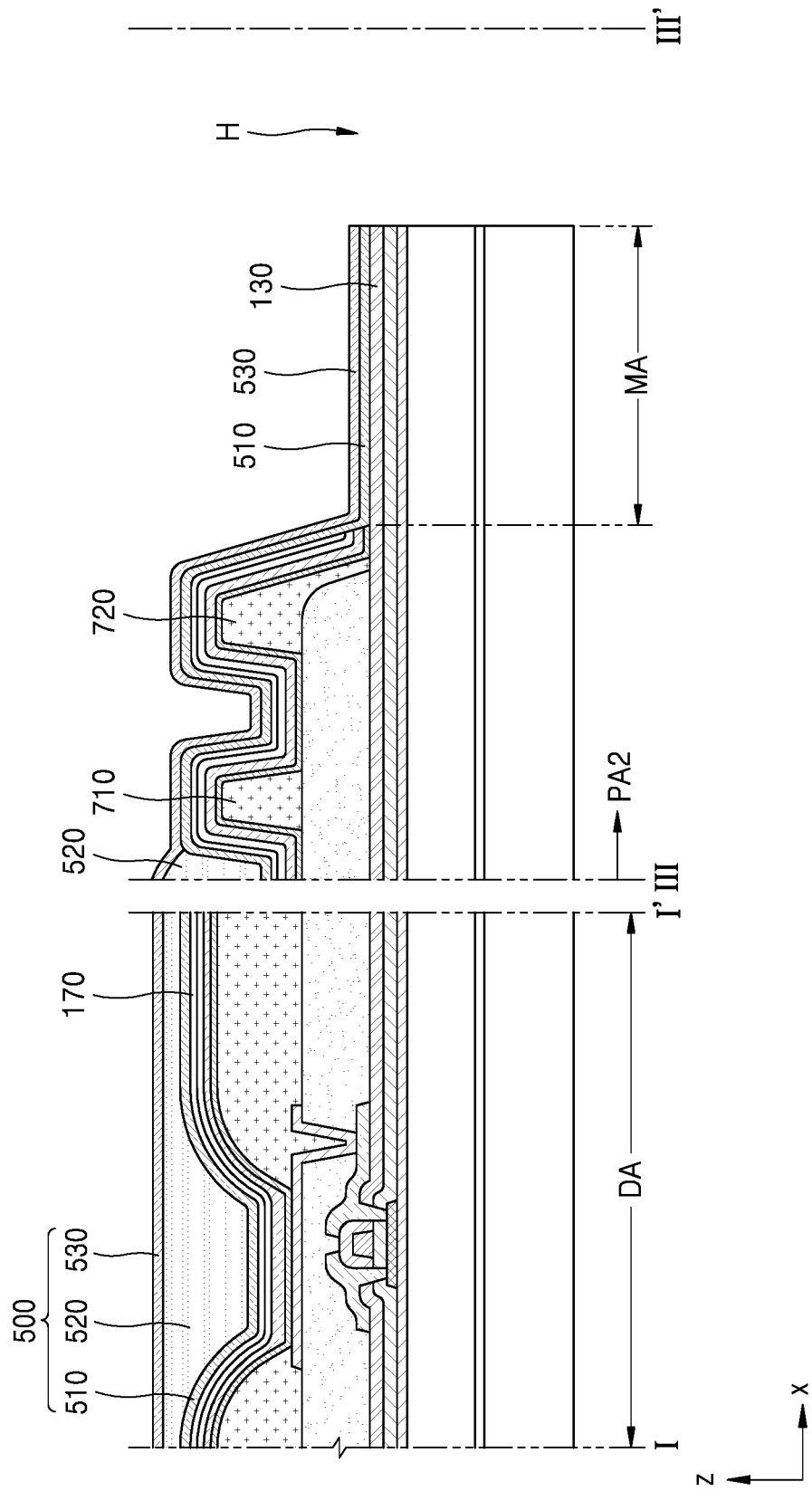

Then, as illustrated in FIGS. 10 and 11, after the metal layer M is removed from the substrate 100 and then the encapsulation layer 500 is formed above the substrate 100, the through portion H penetrating the substrate 100, etc. is formed in the central portion of the second non-display area PA2.

In an embodiment, the metal layer M may be removed by irradiating a laser L in a direction of the substrate 100. When the metal layer M is removed from the substrate 100 by heating the metal layer M by the irradiation of the laser L, the intermediate layer 320 or some layers included in the intermediate layer 320, the opposite electrode 330, the capping layer 160, and the protection layer 170, which are stacked on the metal layer M, may be separated from the substrate 100 together with the metal layer M, and, thus, an organic film included in the intermediate layer 320, etc. may not be continuously formed from the display area DA to the through portion H.

The metal layer M and the planarization layer 140 may be formed to be separated from each other, and some layers included in the intermediate layer 320 may contact the inorganic layer directly under the metal layer M in a gap between the metal layer M and the planarization layer 140. Therefore, because some layers included in the intermediate layer 320, etc. have a step due to the metal layer M and stress may be concentrated on the step, only a region corresponding to the metal layer M may be easily separated during the removal of the metal layer M. Therefore, some of the intermediate layer 320 may be prevented or substantially prevented from being exfoliated from side surfaces of the planarization layer 140 or the second internal dam 720 along the same during the removal of the metal layer M.

After the metal layer M is removed, the first inorganic encapsulation layer 510, the organic encapsulation layer 520, and the second inorganic encapsulation layer 530 are sequentially formed, and the through portion H is formed in the second non-display area PA2.

The first inorganic encapsulation layer 510 and the second inorganic encapsulation layer 530 are formed in the display area DA as well as the second non-display area PA2. On the contrary, the organic encapsulation layer 520 is formed to a limited extent due to the first internal dam 710 and the second internal dam 720. Therefore, in the second non-display area PA2, the first inorganic encapsulation layer 510 and the second inorganic encapsulation layer 530 directly contact each other on the outer portion of the planarization layer 140.

The through hole H may be formed by vertically penetrating the substrate 100, the first inorganic insulating layer 120, the second inorganic insulating layer 130, the first inorganic encapsulation layer 510, and the second inorganic encapsulation layer 530, which are stacked on the substrate 100. Therefore, the moat area MA may be defined as an area excluding the through portion H from the area where the metal layer M is removed in the second non-display area PA2.

Due to the removal of the metal layer M, the first inorganic encapsulation layer 510 may directly contact another inorganic layer thereunder in the moat area MA. For example, the first inorganic encapsulation layer 510 may directly contact the second inorganic insulating layer 130, and, thus, the penetration of moisture, etc. into the display area DA from the side cross-sections of the through portion H may be effectively prevented. Therefore, compared to a comparative example in which grooves surrounding the through portion H are formed in the depthwise direction of the substrate 100 to prevent the moisture penetration, manufacturing processes of the display apparatus (10 of FIG. 1) according to the present disclosure may be simplified.

FIG. 11 illustrates that the first inorganic encapsulation layer 510 directly contacts the second inorganic insulating layer 130 in the moat area MA, but one or more embodiments are not limited thereto, and, as illustrated in FIGS. 6 and 7, the first inorganic encapsulation layer 510 may directly contact the first inorganic insulating layer 120 or the substrate 100 in the moat area MA by setting an area where the first inorganic insulating layer 120 and the second inorganic insulating layer 130 are formed.

According to one or more embodiments of the disclosure, in the display apparatus, a non-display area may be reduced and penetration of external moisture, etc. through a through portion may be prevented or substantially prevented by making the through portion, in which a separate member, such as a camera, is disposed, directly contact a first inorganic layer and a second inorganic layer of an encapsulation layer in an area surrounding the through portion and by making the first inorganic layer directly contact another inorganic layer thereunder. However, the scope of the disclosure is not limited to these aspects or effects.

It is to be understood that the embodiments described herein should be considered in a descriptive sense only and not for purposes of restriction. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth by the following claims.

What is claimed is:

1. A display apparatus comprising:
    a substrate comprising a display area in which a plurality of thin film transistors and a plurality of display devices electrically connected to the plurality of thin film transistors are arranged over an upper surface of the substrate, and a first non-display area outside the display area;
    a through portion penetrating the substrate in a vertical direction;
    a second non-display area between the through portion and the display area;
    an encapsulation layer on the plurality of display devices and comprising a first inorganic encapsulation layer, an organic encapsulation layer, and a second inorganic encapsulation layer, which are sequentially stacked; and
    a planarization layer between the plurality of thin film transistors and the plurality of display devices, the planarization layer extending to a part of the second non-display area and directly contacting another inorganic layer that is under each of the first inorganic encapsulation layer and the planarization layer,
    wherein the first inorganic encapsulation layer and the second inorganic encapsulation layer extend to the through portion and directly contact each other in the second non-display area, and the first inorganic encapsulation layer directly contacts the another inorganic layer along an upper surface of the another inorganic layer in the second non-display area, the upper surface of the another inorganic layer being parallel to the upper surface of the substrate,
    each of the plurality of display devices comprises a pixel electrode on the planarization layer, an opposite electrode on the pixel electrode, and an intermediate layer between the pixel electrode and the opposite electrode, the another inorganic layer extending between the opposite electrode and the substrate in the display area, and at least one of the intermediate layer and the opposite electrode extends outside the planarization layer so as to be between the through portion and a portion of the planarization layer that is nearest to the through portion along a lateral direction intersecting the vertical direction.

2. The display apparatus of claim 1, wherein the first inorganic encapsulation layer directly contacts an upper surface of the substrate in the second non-display area.

3. The display apparatus of claim 2, wherein
the substrate comprises a first base layer, a first barrier layer, a second base layer, and a second barrier layer, which are sequentially stacked, and
the first inorganic encapsulation layer directly contacts the second barrier layer in the second non-display area.

4. The display apparatus of claim 1, further comprising
a first inorganic insulating layer between a semiconductor layer and a gate electrode of each of the plurality of thin film transistors, and a second inorganic insulating layer between the gate electrode and a source electrode and between the gate electrode and a drain electrode of each of the plurality of thin film transistors,
wherein the another inorganic layer, which directly contacts the first inorganic encapsulation layer in the second non-display area, comprises the first inorganic insulating layer or the second inorganic insulating layer.

5. The display apparatus of claim 1, wherein
at least some layers of the intermediate layer and the opposite electrode extend outside the planarization layer.

6. The display apparatus of claim 1, wherein,
in the second non-display area, a first internal dam around the through portion is arranged on the planarization layer, and
the organic encapsulation layer is located outside an area partitioned by the first internal dam.

7. The display apparatus of claim 6, further comprising a pixel-defining layer on the planarization layer and covering edges of pixel electrodes of the plurality of display devices,
wherein the first internal dam comprises a same material as the pixel-defining layer.

8. The display apparatus of claim 6, further comprising a second internal dam in the second non-display area and surrounding the through portion at a location apart from the first internal dam, the second internal dam being on the planarization layer.

9. The display apparatus of claim 6, further comprising a plurality of data lines in the second non-display area and arranged on the another inorganic layer, the planarization layer covering the plurality of data lines, the first internal dam overlapping at least some of the plurality of data lines.

10. A display apparatus comprising:
a substrate comprising a display area in which a plurality of thin film transistors and a plurality of display devices electrically connected to the plurality of thin film transistors are arranged over an upper surface of the substrate, and a first non-display area outside the display area;
a through portion penetrating the substrate in a vertical direction;
a second non-display area between the through portion and the display area;
an encapsulation layer on the plurality of display devices and comprising a first inorganic encapsulation layer, an organic encapsulation layer, and a second inorganic encapsulation layer, which are sequentially stacked;
a planarization layer between the plurality of thin film transistors and the plurality of display devices, the planarization layer extending to a part of the second non-display area and directly contacting another inorganic layer that is under each of the first inorganic encapsulation layer and the planarization layer;
a first internal dam disposed on the planarization layer in the second non-display area and surrounding the through portion; and
a second internal dam disposed on the planarization layer and disposed between the first internal dam and the through portion,
wherein the first inorganic encapsulation layer and the second inorganic encapsulation layer extend to the through portion and directly contact each other in the second non-display area, and the first inorganic encapsulation layer directly contacts the another inorganic layer along an upper surface of the another inorganic layer in the second non-display area, the upper surface of the another inorganic layer being parallel to the upper surface of the substrate,
each of the plurality of display devices comprises a pixel electrode on the planarization layer, an opposite electrode on the pixel electrode, and an intermediate layer between the pixel electrode and the opposite electrode, the another inorganic layer extending between the opposite electrode and the substrate in the display area, and
a portion of at least one of the intermediate layer and the opposite electrode extending outside the planarization layer in a lateral direction intersecting the vertical direction overlaps the second internal dam in the vertical direction.

* * * * *